United States Patent [19]
Wu et al.

[11] Patent Number: 5,784,326
[45] Date of Patent: Jul. 21, 1998

[54] VOLTAGE RAISING DEVICE

[75] Inventors: Shao-Yi Wu; Fu-Chung Wang, both of Hsinchu, Taiwan

[73] Assignee: Holtek Microelectronics Inc., Hsinchu, Taiwan

[21] Appl. No.: 868,731

[22] Filed: Jun. 4, 1997

[51] Int. Cl.$^6$ .................................................. G11C 16/02
[52] U.S. Cl. .......................... 365/185.19; 365/189.09; 365/185.18; 365/226; 327/530
[58] Field of Search ........................ 365/226, 189.09, 365/185.18, 185.19, 185.29; 327/530, 536, 537

[56] References Cited

U.S. PATENT DOCUMENTS

| | | | |
|---|---|---|---|
| 5,412,602 | 5/1995 | Yero | 365/226 |
| 5,461,591 | 10/1995 | Kim et al. | 365/226 |
| 5,521,871 | 5/1996 | Choi | 365/226 |
| 5,687,128 | 11/1997 | Lee et al. | 365/226 |

*Primary Examiner*—David C. Nelms
*Assistant Examiner*—Son Mai
*Attorney, Agent, or Firm*—Friedman Siegelbaum LLP

[57] ABSTRACT

A device for raising voltage comprises a first element for providing a first output pin with a voltage raise in response to a first voltage change at a first input pin, and for providing a second output pin with a voltage raise in response to a second voltage change at a second input pin; and a second element for driving, when the voltage at the first output pin becomes higher than the voltage at the second output pin due to the first voltage change at the first input pin, the second output pin to maintain a voltage keeping pace with the voltage at the first output pin, and for driving, when the voltage at the second output pin becomes higher than the voltage at the first output pin due to the second voltage change at the second input pin, the first output pin to maintain a voltage keeping pace with the voltage at the second output pin.

33 Claims, 3 Drawing Sheets

VOLTAGE RAISING DEVICE

FIELD OF THE INVENTION

The present invention generally relates to a device for raising voltage, particularly to a device for switching between different voltage levels in electronic circuits, and specifically to a device for raising voltage for switching operation modes of an EEPROM.

BACKGROUND OF THE INVENTION

In spite of its higher complexity and longer time consuming in manufacturing, high voltage PMOS had been usually adopted by conventional art to make a circuit for switching between different voltage levels. This is because of a significant voltage drop inherent in high voltage NMOS despite its easier and less expensive fabrication.

It has been long anticipated by those who are in the related fields to have a scheme or device capable of raising voltage without need of PMOS while offering a solution for the big voltage drop problem inherent in NMOS.

SUMMARY OF THE INVENTION

The general object of the present invention is to provide a device for raising voltage in a circuit where higher voltage source is not available, or where higher voltage source is available while switching of higher voltage is not suitable due to the specification or cost limit of the elements in the circuit.

The particular object of the present invention is to provide a device for switching between different voltage levels required for different operation modes of an IC such as an EEPROM.

An embodiment of the present invention may be represented by a circuit including a first element for providing a first output pin thereof with a voltage raise in response to a first voltage change at a first input pin thereof, and for providing a second output pin thereof with a voltage raise in response to a second voltage change at a second input pin thereof; and a second element for driving, when the voltage at the first output pin becomes higher than the voltage at the second output pin due to the first voltage change, the second output pin to maintain a voltage keeping pace with the voltage at the first output pin, and for driving, when the voltage at the second output pin becomes higher than the voltage at the first output pin due to the second voltage change, the first output pin to maintain a voltage keeping pace with the voltage at the second output pin. The voltage change may be either a voltage rise or a voltage decrease. The second output pin is driven to maintain a voltage of first follow level in response to a voltage rise applied to the first input pin, as a result of the voltage raise provided to the first output pin, and the first output pin is driven to maintain a voltage of second follow level in response to a voltage rise applied to the second input pin, as a result of the voltage raise provided to the second output pin. The voltage of first follow level is always following the voltage at the first output pin with a certain difference, and the voltage of second follow level is always following the voltage at the second output pin with a certain difference, whereby the voltage at the first output pin and second output pin can be raised as a voltage rise is alternately applied to the first input pin and the second input pin. Obviously there may be a coupling or the like between the first element and the second element, and it shall not be limited to either photo coupling or electrical coupling.

It can be seen the first output pin is driven by the second element to maintain a voltage keeping pace with the voltage at the second output pin when the first voltage rise at the first input pin is removed and the second voltage rise is applied to the second input pin, whereby when the second voltage rise is applied to the second input pin, the voltage at the first output pin becomes higher than that before the second voltage rise is applied to the second input pin.

It can also be seen the second output pin is driven by the second element to maintain a voltage keeping pace with the voltage at the first output pin when the second voltage rise at the second input pin is removed and the first voltage rise is applied to the first input pin, whereby when the first voltage rise is applied to the first input pin, the voltage at the second output pin becomes higher than that before the first voltage rise is applied to the first input pin.

It shall be understood the voltage raise provided to the first output pin in response to the first voltage change at the first input pin may be equal to the first voltage change, and the voltage raise provided to the second output pin in response to the second voltage change at the second input pin may also be equal to the second voltage change.

Obviously when a sequence of voltage pulses are applied to the first input pin, and an inverse of the sequence of voltage pulses are applied to the second input pin, the voltage at the first output pin and the second output pin can be raised fast and easily.

The first element may include a capacitive structure for capacitively coupling the first voltage change from the first input pin to the first output pin, whereby the first output pin is provided with a voltage raise in response to the first voltage change at the first input pin. Actually it may comprise a first NMOSFET having a drain thereof and a source thereof coupled together to form the first input pin, and having a gate thereof used as aid first output pin; and a second NMOSFET having a drain thereof and a source thereof coupled together to form the second input pin, and having a gate thereof used as the second output pin.

In the embodiment suggested by the present invention, the second element may comprise a third NMOSFET having a drain thereof and a gate thereof coupled together with the first output pin, and a source thereof coupled with the second output pin; and a fourth NMOSFET having a source thereof coupled with the first output pin, a gate thereof coupled with the second output pin. The fourth NMOSFET further include a drain thereof for inputting an object voltage and provides the first output pin with a voltage raise capable of reaching the object voltage.

The embodiment suggested by the present inventions may further comprise a pulse circuit for providing the first input pin with a first sequence of voltage pulses, and for providing the second input pin with a second sequence of voltage pulses, the second sequence of voltage pulses are formed by inverting the first sequence of voltage pulses, whereby the voltage pulse can be alternately applied to the first input pin and the second input pin.

An initialize circuit may be included for providing the second output pin with an initial voltage before the first voltage rise is applied to the first input pin. It may be a NMOSFET comprising an initialize gate and an initialize source and an initialize drain, the initialize source inputs a first reference voltage, the initialize drain is coupled with the second output pin, the initialize drain outputs the initial voltage to the second output pin when a second reference voltage is applied to the initialize gate. It can be understood the first reference voltage shall be lower than the object voltage.

The embodiment suggested by the present invention further comprises a one-way element, and a voltage raise output pin coupled with the second output pin through the one-way element, the one-way element drives the voltage raise output pin to maintain a follow voltage when the voltage at the second output pin is higher than the voltage at the voltage raise output pin, the follow voltage is of a certain difference from the voltage at the second output pin.

Obviously a limit circuit may be adopted for limiting the voltage at the voltage raise output pin. It can be a NMOSFET having a gate thereof and a drain thereof coupled together with the voltage raise output pin, and having a source thereof coupled with the object voltage.

The pulse circuit described above can be so designed as to provide the first sequence of voltage pulses and the second sequence of voltage pulses when and only when a third sequence of voltage pulses together with an enable voltage are received thereat. It may include a first inverter and a second inverter, and a NAND gate for providing a fourth sequence of pulses when and only when the third sequence of voltage pulses together with the enable voltage are received by the pulse circuit; the first inverter is to provide the first sequence of pulses which are the inverse of the fourth sequence of pulses; the second inverter is for providing the second sequence of pulses which are the inverse of the first sequence of pulses.

The embodiment suggested by the present invention may further comprise a NMOSFET having the gate thereof inputted with a voltage; and the source thereof coupled with the voltage raise output pin; and the drain thereof for receiving the enable voltage, whereby the voltage raise output pin is driven to maintain an initial output voltage unless the enable voltage is received by the drain thereof. Obviously the initial output voltage can be a zero voltage.

The one-way element mentioned above may be a NMOSFET with the gate thereof and the drain thereof coupled together with the second output pin, and with the source thereof coupled to the voltage raise output pin.

It can be realized all of the "fixed difference" mentioned above may be the voltage drop from the gate of the NMOSFET to the source of the NMOSFET no matter whether the gate is coupled with the drain or not.

It must be pointed out the pulse circuit mentioned above can be so designed as to provide, when and only when a third sequence of pulses are applied to the pulse input pin and meantime an enable voltage is applied to the enable input pin, the first input pin with a first sequence of pulses and for providing the second input pin with a second sequence of pulses, whereby when and only when the third sequence of pulses are applied to a pulse input pin thereof and meantime the enable voltage is applied to an enable input pin thereof, the voltage at the voltage raise output pin can be raised as a result of the voltage raise provided to the second output pin.

One of the applications of the embodiment suggested by the present invention is to couple the voltage raise output pin to an input pin of an EEPROM cell for clearing the EEPROM cell when and only when the third sequence of pulses are applied to the pulse input pin and meantime the enable voltage is applied to the enable input pin, whereby the switching for clear operation of the EEPROM can be easily and conveniently implemented without need of PMOSFET and without need of tackling big voltage drop problem inherent in switching, by NMOSFET, the voltage required for clear operation of the EEPROM.

Another application of the embodiment suggested by the present invention is to couple the voltage raise output pin to an input pin of an EEPROM cell for activating the write mode of the EEPROM cell when and only when the third sequence of pulses are applied to the pulse input pin and meantime the enable voltage is applied to the enable input pin, whereby the activation of write mode of the EEPROM can be easily and conveniently implemented without need of PMOSFET and without need of tackling big voltage drop problem inherent in switching, by NMOSFET, the voltage required for write mode of the EEPROM.

The present invention may best be understood through the following description with reference to the accompanying drawings, in which:

DETAILED DESCRIPTION OF THE PREFERRED EMBODIMENTS

Figure 1:
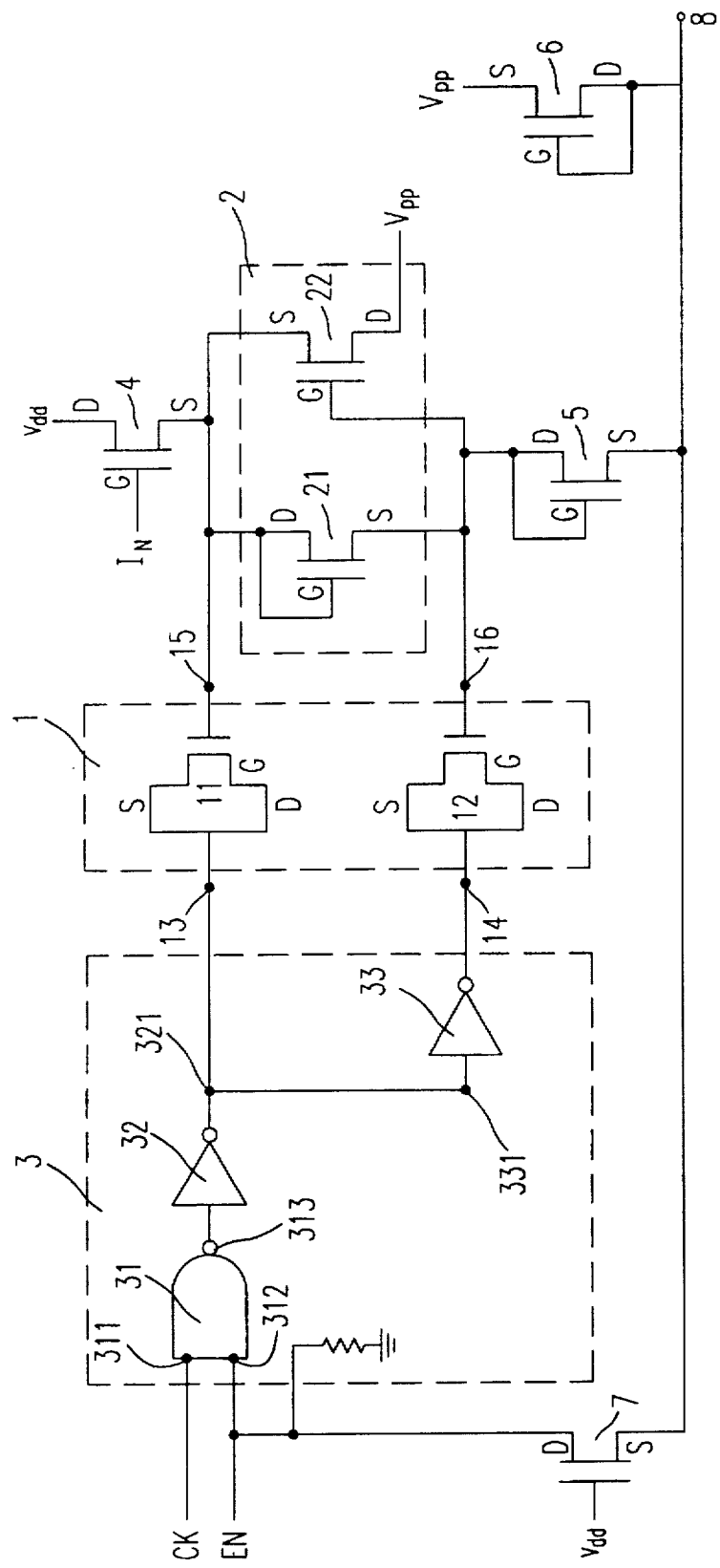
FIG. 1 is a circuit diagram representing one preferred embodiment of the present invention.

FIG. 1 shows a first element 1, a second element 2, a NMOSFET 4, NMOSFET 5, a NMOSFET 6, a pulse circuit 3, a NMOSFET 7, and output pin 8 included in the embodiment. First element 1 includes: a first input pin 13, a second input pin 14, a first output pin 15, a second output pin 16, a NMOSFET 11 having source and drain coupled together with for inputting 13 and with gate coupled with first output pin 15, and a NMOSFET 12 having source and drain coupled together with second input pin 14 and having gate coupled with second output pin 16; second element 2 includes a NMOSFET 21 having drain and gate coupled with first output pin 15 and having source coupled with second output pin 16, and a NMOSFET 22 having source coupled with first output pin 15 and gate coupled with second output pin 16 and drain to input an object voltage Vpp; pulse circuit 3 includes a NAND gate 31 having two input pins 311 and 312 for respectively inputting a clock pulse and an enable signal, and an output pin 313, input pin 312 is so designed as to maintain a zero voltage unless the enable voltage is inputted there, pulse circuit 3 also includes an inverter 32 having only one input pin which is coupled with output pin 313 of NAND gate 31 and only one output pin 321 coupled with input pin 13 of first element 1, also included in pulse circuit 3 is another inverter 33 having input pin 331 coupled with output pin 321 of inverter 32 and having output pin coupled to input pin 14 of first element 1; NMOSFET 4 has gate for inputting an initialize control voltage IN and drain for inputting a reference voltage Vdd and source coupled with first output pin 15 for outputting an initial voltage to first output pin 15 when the initialize control voltage IN is applied to the gate; NMOSFET 5 has gate and drain coupled together with second output pin 16 and source coupled with output pin 8 of the embodiment; NMOSFET 6 has source for inputting object voltage Vpp, and gate together with drain are coupled to output pin 8 of the embodiment; NMOSFET 7 has drain coupled with input pin 312 of NAND 31 for inputting the enable signal and gate for inputting the reference voltage and source coupled with output pin 8 of the embodiment.

Described hereinafter is the operation of the preferred embodiment with reference to FIG. 1. As can be seen from FIG. 1, when the enable voltage is inputted to input pin 312 of NAND gate 31, and a clock pulse CK is inputted to input pin 311, a sequence of pulses CLK will be inputted to first input pin 13 of first element 1 and the inverse of the sequence of pulses CLKB will be inputted to second input pin 14 of first element 1; NMOSFET 11 in first element 1 will, based on the capacitive structure inherent therein, capacitively couple the voltage rise of each pulse from first input pin 13 to first output pin 15, and hence will provide first output pin 15 with a voltage raise in response to the voltage rise of each pulse inputted to first input pin 13. Due to the special feature of element 2 by which the voltage at second output pin 16 always follows the voltage of first output pin 15 when the voltage at first output pin 15 is higher than that of second output pin 16, the voltage raise at first output pin 15 which results in a higher voltage of first output pin 15 than second output pin 16 drives second output pin 16 to maintain a voltage which is slightly lower than first output pin 15 (a certain difference). Similarly NMOSFET 12 in first element 1 will, based on the capacitive structure (characteristic and function are equivalent to a general purpose capacitor) inherent therein, capacitively couple the voltage rise of each pulse from second input pin 14 to second output pin 16, and hence will provide second output pin 16 with a voltage raise in response to the voltage rise of each pulse inputted to second input pin 14. Due to the special feature of element 2 by which the voltage at first output pin 15 always follows the voltage of second output pin 16 when the voltage at second output pin 16 is higher than that of first output pin 15, the voltage raise at second output pin 16 which results in a higher voltage of second output pin 16 than first output pin 15 drives first output pin 15 to maintain a voltage which is slightly lower than second output pin 16 (a certain difference). Obviously that the sequence of pulses and the inverse of the sequence of pulses are respectively inputted to first input pin 13 and second input pin 14 results in the alternate applying of a sequence of voltage rise to first input pin 13 and second input pin 14, which in turn pull the voltage at first output pin 15 and the voltage at second output pin 16 alternately higher than each other, and the voltage at first output pin 15 and the voltage at second output pin 16 are thus naturally raised due to the special feature of second element 2 which drives the voltage at first output pin 15 and the voltage at second output pin 16 to follow each other. Being coupled with the drain of NMOSFET 22, object voltage Vpp is for the voltage of first output pin 15 to be raised for reaching a voltage level equivalent to Vpp.

The embodiment can be so designed that the voltage of pin 312 which is coupled with the drain of NMOSFET 7 is maintained at zero unless the enable voltage EN is inputted to pin 312, whereby when EN is not inputted to pin 312, the voltage of the drain of NMOSFET 7 is zero and hence the output pin 8 of the embodiment coupled with the source of NMOSFET 7 is driven to maintain an initial voltage of zero through NMOSFET 7 the gate of which inputs a reference voltage Vdd.

It can be seen from the above description that the voltage at first output pin 15 and second output pin 16 of first element 1 can be raised when the enable voltage EN is inputted to pin 312 and meantime a clock pulse is inputted to pin 311, and in turn output pin 8 is driven, through NMOSFET 5, to maintain a voltage slightly lower (a certain difference) than the voltage at second output pin 16, whereby the voltage at output pin 8 can be raised as a result of that it keeps pace with the voltage of second output pin 16 which is raised in response to the voltage rise of the clock pulse inputted to pin 311. With source inputting object voltage Vpp and gate together with drain coupled to output pin 8, NMOSFET 6 obviously can limit the voltage of output pin to Vpp.

Figure 2:
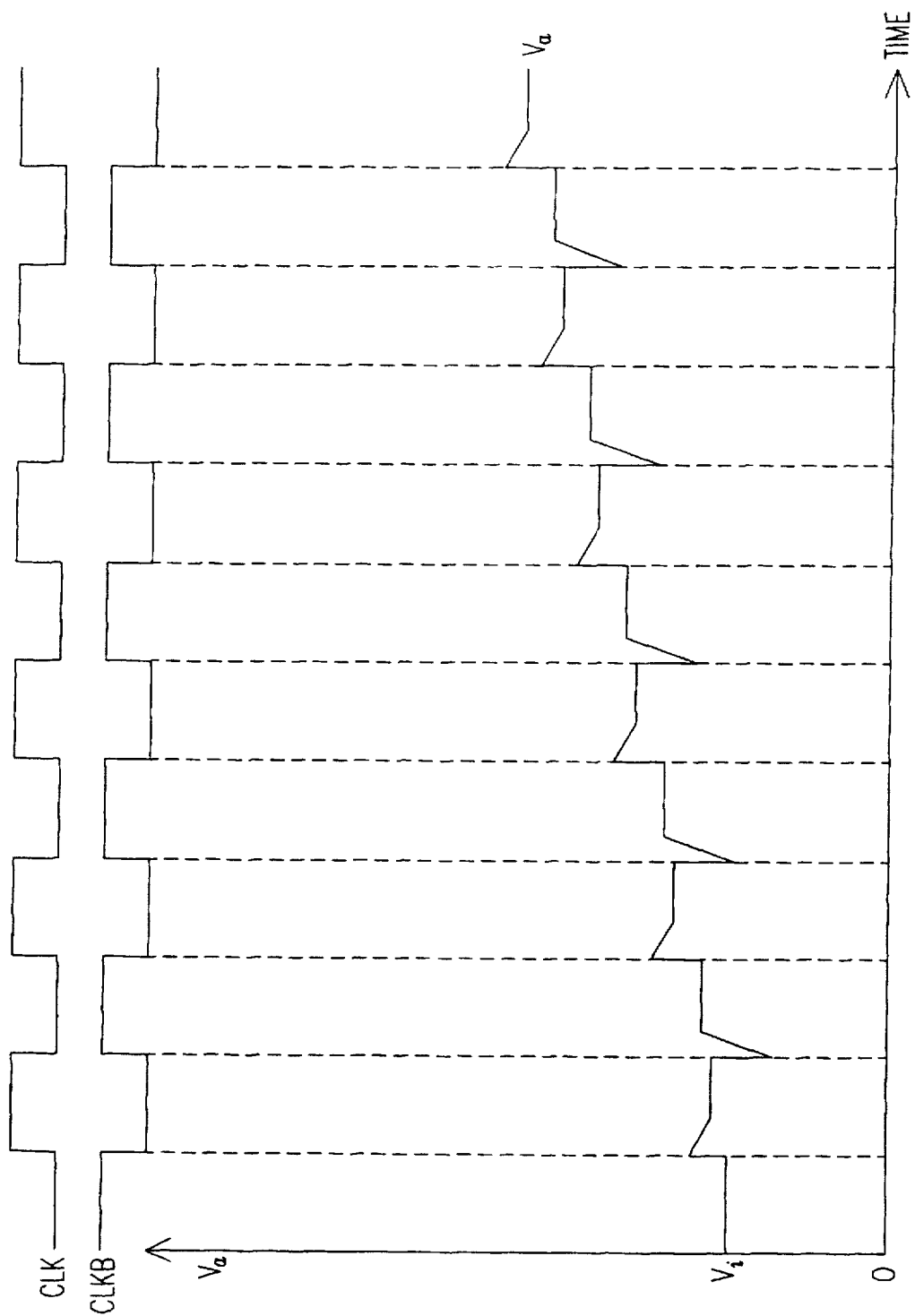
FIG. 2 is a time chart for illustrating the voltage raised by the preferred embodiment of the present invention.

In FIG. 2, Va represents the voltage at first output pin 15 of the preferred embodiment of the present invention shown in the circuit diagram of FIG. 1 where a sequence of pulses CLK are applied to first input pin 13 and the inverse of the sequence of pulses CLKB are applied to second input pin 14. Obviously the time charts for CLK, CLKB, Va are all based on the horizontal time axis. Vi is the initial voltage before CLK and CLKB are applied.

Figure 3:
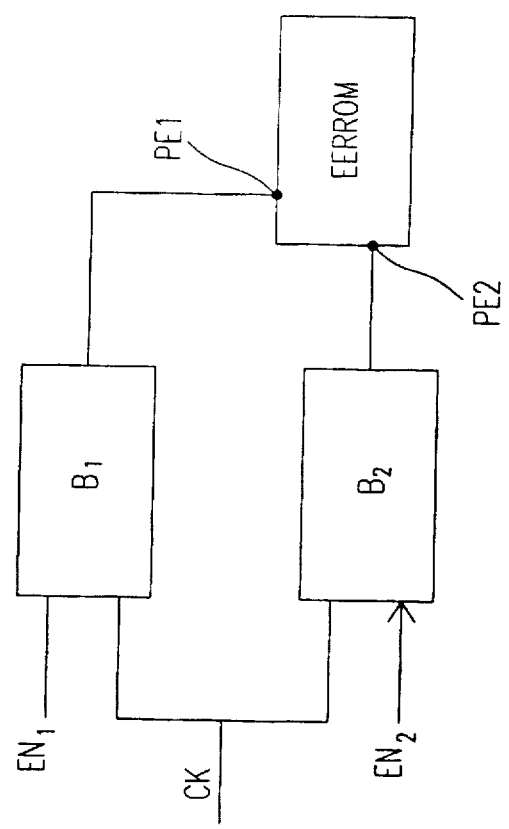
FIG. 3 is a block diagram for illustrating an application of the preferred embodiment of the present invention.

In FIG. 3 block B1 represents an embodiment of the present invention for providing, when a clock pulse CK and a first enable signal EN1 are simultaneously inputted thereto (pin 311 and 312 of the embodiment in FIG. 1 for example), an input pin PE1 of an EEPROM cell with a higher voltage to activate clear operation of the EEPROM cell, block B2 represents an embodiment of the present invention for providing, when a clock pulse CK and a second enable signal EN2 are simultaneously inputted thereto (pin 311 and 312 of the embodiment in FIG. 1 for example), an input pin PE2 of the EEPROM cell with a higher voltage to activate write mode of the EEPROM cell. It can be seen EN1 and EN2 can be so controlled that PE1 and PE2 are respectively provided with the higher voltage whenever clear operation or write mode of the EEPROM cell is required.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A device for raising voltage, comprising:
    a first element for providing a first output pin thereof with a voltage raise in response to a first voltage change at a first input pin thereof, and for providing a second output pin thereof with a voltage raise in response to a second voltage change at a second input pin thereof;
    a second element for driving, when the voltage at said first output pin becomes higher than the voltage at said second output pin due to said first voltage change, said second output pin to maintain a voltage keeping pace with the voltage at said first output pin, and for driving, when the voltage at said second output pin becomes higher than the voltage at said first output pin due to said second voltage change, said first output pin to maintain a voltage keeping pace with the voltage at said second output pin.

2. The device according to claim 1 wherein said first voltage change and said second voltage change are respectively a first voltage rise and a second voltage rise.

3. The device according to claim 1 wherein one between a voltage rise and a voltage decrease is applied to said first input pin as said first voltage change, and one between a voltage rise and a voltage decrease is applied to said second input pin as said second voltage change.

4. The device according to claim 2 wherein said second element drives, when the voltage at said second output pin is higher than the voltage at said first output pin, said first output pin to maintain a voltage of a certain difference from the voltage at said second output pin, whereby the voltage at said first output pin is driven to maintain a voltage keeping pace with the voltage at said second output pin.

5. The device according to claim 2 wherein said second element driving, when the voltage at said first output pin is higher than the voltage at said second output pin, said second output pin to maintain a voltage of a certain difference from the voltage at said first output pin, whereby the voltage at said second output pin is driven to maintain a voltage keeping pace with the voltage at said first output pin.

6. The device according to claim 2 wherein said first output pin is driven by said second element to maintain a voltage keeping pace with the voltage at said second output pin when said first voltage rise at said first input pin is removed and said second voltage rise is applied to said second input pin, whereby when said second voltage rise is applied to said second input pin, the voltage at said first output pin becomes higher than that before said second voltage rise is applied to said second input pin.

7. The device according to claim 2 wherein said second output pin is driven by said second element to maintain a voltage keeping pace with the voltage at said first output pin when said second voltage rise at said second input pin is removed and said first voltage rise is applied to said first input pin, whereby when said first voltage rise is applied to said first input pin, the voltage at said second output pin becomes higher than that before said first voltage rise is applied to said first input pin.

8. The device according to claim 1 wherein the voltage raise provided to said first output pin in response to said first voltage change at said first input pin is equal to said first voltage change.

9. The device according to claim 1 wherein the voltage raise provided to said second output pin in response to said second voltage change at said second input pin is equal to said second voltage change.

10. The device according to claim 1 wherein a sequence of voltage pulses are applied to said first input pin, and an inverse of said sequence of voltage pulses are applied to said second input pin, whereby the voltage at said first output pin and said second output pin can be raised fast and easily.

11. The device according to claim 1 wherein said first element comprising a capacitive structure for capacitively coupling said first voltage change from said first input pin to said first output pin, whereby said first output pin is provided with a voltage raise in response to said first voltage change at said first input pin.

12. The device according to claim 1 wherein said first element comprising a capacitive structure for capacitively coupling said second voltage change from said second input pin to said second output pin, whereby said second output pin is provided with a voltage raise in response to said second voltage change at said second input pin.

13. The device according to claim 4 wherein said first element comprising a first NMOSFET having a drain thereof and a source thereof coupled together to form said first input pin, and having a gate thereof used as said first output pin; and a second NMOSFET having a drain thereof and a source thereof coupled together to form said second input pin, and having a gate thereof used as said second output pin.

14. The device according to claim 5 wherein said second element comprising a third NMOSFET having a drain thereof and a gate thereof coupled together with said first output pin, and a source thereof coupled with said second output pin; and a fourth NMOSFET having a source thereof coupled with said first output pin, a gate thereof coupled with said second output pin.

15. The device according to claim 14 wherein said fourth NMOSFET further having a drain thereof for inputting an object voltage and providing said first output pin with a voltage raise capable of reaching said object voltage.

16. The device according to claim 1 further comprising a pulse circuit for providing said first input pin with a first sequence of voltage pulses, and for providing said second input pin with a second sequence of voltage pulses, said second sequence of voltage pulses are formed by inverting said first sequence of voltage pulses, whereby a voltage change is alternately applied to said first input pin and said second input pin.

17. The device according to claim 2 further comprising an initialize circuit for providing said second output pin with an initial voltage before said first voltage change is applied to said first input pin.

18. The device according to claim 17 wherein said initialize circuit is a NMOSFET comprising an initialize gate and an initialize source and an initialize drain, said initialize drain inputs a first reference voltage, said initialize source is coupled with said second output pin, and outputs said initial voltage to said second output pin when a second reference voltage is applied to said initialize gate.

19. The device according to claim 18 wherein said first reference voltage is lower than said object voltage.

20. The device according to claim 1 further comprising a one-way element, and a voltage raise output pin coupled with said second output pin through said one-way element, said one-way element drives, when the voltage at said second output pin is higher than the voltage at said voltage raise output pin, said voltage raise output pin to maintain a voltage of a certain difference from the voltage at said second output pin.

21. The device according to claim 20 further comprising a limit circuit for limiting the voltage at said voltage raise output pin.

22. The device according to claim 21 wherein said limit circuit is a NMOSFET having a gate thereof and a drain thereof coupled together with said voltage raise output pin, and having a source thereof coupled with said object voltage.

23. The device according to claim 16 wherein said pulse circuit provides said first sequence of voltage pulses and said second sequence of voltage pulses when and only when a third sequence of voltage pulses together with an enable voltage are inputted thereto.

24. The device according to claim 23 wherein said pulse circuit comprising a NAND gate and a first inverter and a second inverter, said NAND gate for providing a fourth sequence of pulses when and only when said third sequence of voltage pulses together with said enable voltage are inputted to said pulse circuit; said first inverter for providing said first sequence of pulses which are the inverse of said fourth sequence of pulses; said second inverter for providing said second sequence of pulses which are the inverse of said first sequence of pulses.

25. The device according to claim 23 further comprising a NMOSFET having the gate thereof inputted with a voltage; and the source thereof coupled with said voltage raise output pin; and the drain thereof for inputting said enable voltage, whereby said voltage raise output pin is driven to maintain an initial output voltage unless said enable voltage is inputted by the drain thereof.

26. The device according to claim 25 wherein said initial output voltage is a zero voltage.

27. The device according to claim 20 wherein said one-way element is a NMOSFET with the gate thereof and the drain thereof coupled together with said second output pin, and with the source thereof coupled to said voltage raise output pin.

28. The device according to claim 13 wherein said certain difference is the voltage drop from the gate of said NMOSFET to the source of said NMOSFET.

29. The device according to claim 14 wherein said certain difference is the voltage drop from the gate of said NMOSFET to the source of said NMOSFET.

30. The device according to claim 27 wherein said a certain difference is the voltage drop from the gate of said NMOSFET to the source of said NMOSFET.

31. The device according to claim 20 further comprising a pulse circuit for providing, when and only when a third sequence of pulses and an enable voltage are inputted thereto, said first input pin with a first sequence of pulses and said second input pin with a second sequence of pulses, whereby when and only when said third sequence of pulses and said enable voltage are inputted thereto, the voltage at said voltage raise output pin can be raised as a result of the voltage raise provided to said second output pin.

32. The device according to claim 31 wherein said voltage raise output pin is coupled with an input pin of an EEPROM cell, and clears said EEPROM cell when and only when said third sequence of pulses and said enable voltage are inputted to said pulse circuit, whereby the switching for clear operation of said EEPROM cell can be easily and conveniently implemented without need of PMOSFET and without need of tackling big voltage drop problem inherent in switching, by NMOSFET, the voltage required for clear operation of said EEPROM cell.

33. The device according to claim 31 wherein said voltage raise output pin is coupled with an input pin of an EEPROM cell, and activates the write mode of said EEPROM cell when and only when said third sequence of pulses and said enable voltage are inputted to said pulse circuit, whereby the activation of write mode of said EEPROM cell can be easily and conveniently implemented without need of PMOSFET and without need of tackling big voltage drop problem inherent in switching, by NMOSFET, the voltage required for write mode of said EEPROM cell.

* * * * *